United States Patent
Tang et al.

(10) Patent No.: US 11,489,439 B1
(45) Date of Patent: Nov. 1, 2022

(54) SPIKE SUPPRESSION CIRCUIT AND POWER CONVERTER AND CONTROL METHOD THEREOF

(71) Applicant: Richtek Technology Corporation, Zhubei (TW)

(72) Inventors: Chien-Fu Tang, Hsinchu (TW); Tzu-Chen Lin, Tianzhong Township, Changhua County (TW); Ta-Yung Yang, Taoyuan (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 0 days.

(21) Appl. No.: 17/468,932

(22) Filed: Sep. 8, 2021

Related U.S. Application Data

(60) Provisional application No. 63/176,941, filed on Apr. 20, 2021.

(30) Foreign Application Priority Data

Jul. 27, 2021 (TW) .................................. 110127507

(51) Int. Cl.
| | |
|---|---|
| *H02M 1/34* | (2007.01) |
| *H02M 3/335* | (2006.01) |
| *H02M 1/32* | (2007.01) |
| *H03K 3/0233* | (2006.01) |
| *H02M 1/00* | (2006.01) |
| *G05F 1/575* | (2006.01) |
| *G05F 3/18* | (2006.01) |

(Continued)

(52) U.S. Cl.
CPC ...... *H02M 1/342* (2021.05); *G01R 19/16538* (2013.01); *G05F 1/575* (2013.01); *G05F 3/18* (2013.01); *H02H 9/042* (2013.01); *H02M 1/0025* (2021.05); *H02M 1/325* (2021.05); *H02M 3/33507* (2013.01); *H02M 3/33576* (2013.01); *H03K 3/02337* (2013.01)

(58) Field of Classification Search
CPC .......................... H02M 1/342; H02M 3/33507
See application file for complete search history.

(56) References Cited

U.S. PATENT DOCUMENTS

| | | | | |
|---|---|---|---|---|
| 6,043,636 | A | * 3/2000 | Gaudreau | ............... H02M 1/34 323/285 |
| 10,784,795 | B1 | 9/2020 | Chao et al. | |

(Continued)

FOREIGN PATENT DOCUMENTS

| | | | |
|---|---|---|---|
| CN | 211579897 U | * | 9/2020 |
| CN | 113612393 A | * | 11/2021 |

(Continued)

*Primary Examiner* — Sisay G Tiku
(74) *Attorney, Agent, or Firm* — McClure, Qualey & Rodack, LLP

(57) ABSTRACT

A spike suppression circuit includes a wide bandgap transistor, a first transistor, a clamping circuit, and a capacitor. The wide bandgap transistor is depletion-type. The first transistor is coupled in series with the wide bandgap transistor. The clamping circuit provides a voltage difference, and is coupled to a common node between the wide bandgap transistor and the first transistor. The capacitor provides a supply voltage for the clamping circuit. When the first transistor is turned off, the capacitor can recycle spike energy at the common node.

20 Claims, 5 Drawing Sheets

(51) Int. Cl.
*H02H 9/04* (2006.01)
*G01R 19/165* (2006.01)

(56) References Cited

U.S. PATENT DOCUMENTS

| | | | | |
|---|---|---|---|---|
| 2009/0290276 | A1* | 11/2009 | Carcouet | H02H 9/042 |
| | | | | 361/93.9 |
| 2019/0280464 | A1* | 9/2019 | Tang | F02P 11/00 |
| 2020/0059157 | A1* | 2/2020 | Xiao | H02M 7/219 |
| 2020/0083795 | A1* | 3/2020 | Chao | H03K 17/08116 |
| 2020/0321960 | A1* | 10/2020 | Chao | H03K 17/687 |
| 2021/0058000 | A1 | 2/2021 | Ahmed et al. | |
| 2021/0108605 | A1 | 4/2021 | Yamagishi | |

FOREIGN PATENT DOCUMENTS

| | | | | |
|---|---|---|---|---|
| EP | 2211451 A2 * | 7/2010 | | H02M 1/34 |
| TW | 202110062 A | 3/2021 | | |

\* cited by examiner

SPIKE SUPPRESSION CIRCUIT AND POWER CONVERTER AND CONTROL METHOD THEREOF

CROSS REFERENCE TO RELATED APPLICATIONS

This application claims priority to U.S. Provisional Application Ser. No. 63/176,941, filed on Apr. 20, 2021, and also claims priority of Taiwan Patent Application No. 110127507 filed on Jul. 27, 2021, the entirety of which is incorporated by reference herein.

BACKGROUND OF THE INVENTION

Field of the Invention

The disclosure generally relates to a spike suppression circuit, and more specifically, to a spike suppression circuit for saving power.

Description of the Related Art

With the advancements being made in semiconductor manufacturing, wide bandgap power devices have become more and more popular. However, in some previous circuit designs, wide bandgap power devices and their matched transistors have the disadvantage of tending to generate spikes, which cause extra power consumption and reduce the stability of the overall system. Accordingly, there is a need to propose a novel solution for solving the problems of the prior art.

BRIEF SUMMARY OF THE INVENTION

In an exemplary embodiment, the invention is directed to a spike suppression circuit that includes a wide bandgap transistor, a first transistor, a clamping circuit, and a capacitor. The wide bandgap transistor is depletion-type. The first transistor is coupled in series with the wide bandgap transistor. The clamping circuit provides a voltage difference, and is coupled to a common node between the wide bandgap transistor and the first transistor. The capacitor provides a supply voltage for the clamping circuit. When the first transistor is turned off, the capacitor can recycle spike energy at the common node.

In some embodiments, the spike suppression circuit further includes a control circuit. The control circuit generates a selection voltage according to the supply voltage, such that the spike suppression circuit operates in an initial mode or a stable mode.

In some embodiments, the supply voltage plus the voltage difference is greater than the absolute value of the threshold voltage of the wide bandgap transistor.

In some embodiments, the wide bandgap transistor has a control terminal coupled to a control node, a first terminal coupled to the common node, and a second terminal coupled to an external node.

In some embodiments, the first transistor has a control terminal for receiving a PWM (Pulse Width Modulation) voltage, a first terminal coupled to a connection node, and a second terminal coupled to the common node.

In some embodiments, the spike suppression circuit further includes a first resistor. The first resistor has a first terminal coupled to the connection node, and a second terminal coupled to a ground voltage.

In some embodiments, the capacitor has a first terminal coupled to a supply node for outputting the supply voltage, and a second terminal coupled to a ground voltage.

In some embodiments, the spike suppression circuit further includes an LDO (Low-Dropout Regulator) coupled to the supply node. The LDO is configured to stabilize the supply voltage.

In some embodiments, the clamping circuit includes a first Zener diode and a first diode. The first Zener diode has an anode coupled to the supply node, and a cathode coupled to an internal node. The first diode has an anode coupled to the common node, and a cathode coupled to the internal node.

In some embodiments, the spike suppression circuit further includes a second Zener diode. The second Zener diode has an anode coupled to a ground voltage, and a cathode coupled to the control node.

In some embodiments, the spike suppression circuit further includes a second transistor and a large resistor. The second transistor has a control terminal for receiving the selection voltage, a first terminal coupled to a ground voltage, and a second terminal coupled to the control node. The large resistor has a first terminal coupled to the control node, and a second terminal coupled to the common node.

In some embodiments, the control circuit has hysteresis characteristics. The selection voltage becomes a high logic level when the supply voltage rises up to an enable threshold value. The selection voltage becomes a low logic level when the supply voltage falls down to a disable threshold value.

In some embodiments, the control circuit includes a voltage divider, a hysteresis comparator, and an inverter. The voltage divider includes a second resistor and a third resistor coupled in series. The voltage divider generates a divided voltage according to the supply voltage. The hysteresis comparator compares the divided voltage with a first threshold value and a second threshold value, so as to generate a comparison voltage. The inverter inverts the comparison voltage, so as to generate the selection voltage.

In some embodiments, the wide bandgap transistor has a control terminal coupled to a ground voltage, a first terminal coupled to the common node, and a second terminal coupled to an external node.

In some embodiments, the spike suppression circuit further includes a switch element controlled according to the selection voltage. The switch element has a first terminal coupled to the supply node, and a second terminal coupled to the internal node. The switch element is closed in the initial mode. The switch element is opened in the stable mode.

In another exemplary embodiment, the invention is directed to a power converter that includes a transformer and a spike suppression circuit. The transformer generates an output voltage according to an input voltage. The spike suppression circuit is coupled to the transformer. The spike suppression circuit includes a wide bandgap transistor, a first transistor, a clamping circuit, and a capacitor. The wide bandgap transistor is depletion-type. The first transistor is coupled in series with the wide bandgap transistor. The clamping circuit provides a voltage difference, and is coupled to a common node between the wide bandgap transistor and the first transistor. The capacitor provides a supply voltage for the clamping circuit. When the first transistor is turned off, the capacitor can recycle spike energy at the common node.

In some embodiments, the power converter is a flyback converter and supports USB PD (Universal Serial Bus Power Delivery).

In some embodiments, the transformer includes a main coil, a secondary coil, and an auxiliary coil. The main coil has a first terminal for receiving the input voltage, and a second terminal coupled to the wide bandgap transistor. The secondary coil has a first terminal coupled to an output node, and a second terminal coupled to a ground voltage. The auxiliary coil has a first terminal coupled to a feedback node, and a second terminal coupled to the ground voltage.

In some embodiments, the power converter further includes an LDO (Low-Dropout Regulator), a second diode, and a third diode. The LDO is configured to stabilize the supply voltage. The second diode has an anode coupled to the feedback node, and a cathode coupled to the LDO. The third diode has an anode coupled to the output node, and a cathode for outputting the output voltage.

In another exemplary embodiment, the invention is directed to a control method for spike suppression. The control method includes the following steps: a wide bandgap transistor in series with a first transistor, wherein the wide bandgap transistor is depletion-type; providing a voltage difference by a clamping circuit, wherein the clamping circuit is coupled to a common node between the wide bandgap transistor and the first transistor; and providing a supply voltage for the clamping circuit by a capacitor, wherein when the first transistor is turned off, the capacitor is capable of recycling spike energy at the common node.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail below.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
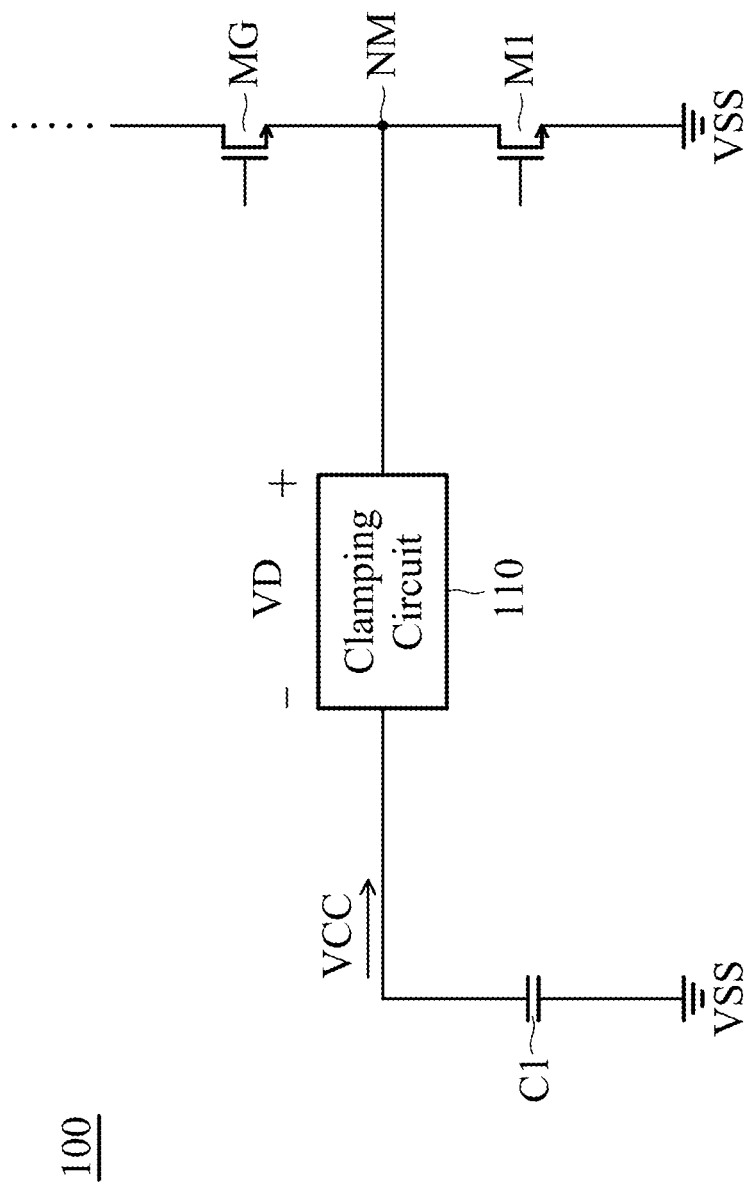
FIG. 1 is a diagram of a spike suppression circuit according to an embodiment of the invention.

FIG. 1 is a diagram of a spike suppression circuit 100 according to an embodiment of the invention. For example, the spike suppression circuit 100 may be applied to a power converter, but it is not limited thereto. In the embodiment of FIG. 1, the spike suppression circuit 100 includes a wide bandgap transistor MG, a first transistor M1, a capacitor C1, and a clamping circuit 110.

The first transistor M1 is coupled in series with the wide bandgap transistor MG. In some embodiments, the wide bandgap transistor MG is depletion-type, and the first transistor M1 is enhancement-type. The clamping circuit 110 provides a voltage difference VD. The clamping circuit 110 is coupled to a common node NM between the wide bandgap transistor MG and the first transistor M1. The capacitor C1 provides a supply voltage VCC for the clamping circuit 110. It should be noted that when the first transistor M1 is turned off, the capacitor C1 is capable of recycling the spike energy at the common node NM. With such a design, the spike suppression circuit 100 not only suppresses the non-ideal spikes but also stores the spike energy into the capacitor C1, and it can significantly improve the power consumption and the stability of the relative device.

The following embodiments will introduce the detailed structure and application of the spike suppression circuit 100. It should be understood these figures and descriptions are merely exemplary, rather than limitations of the invention.

Figure 2:
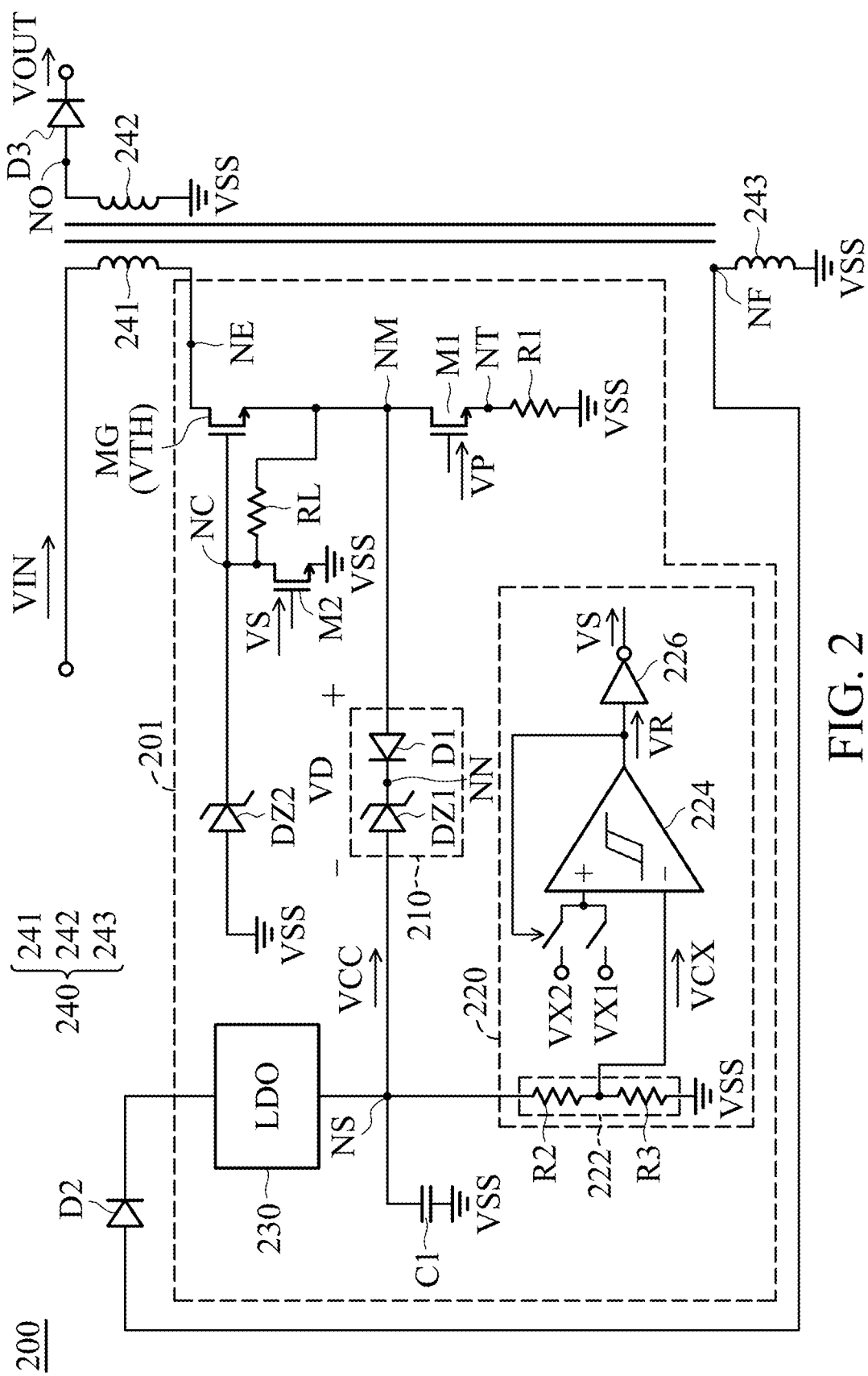
FIG. 2 is a diagram of a power converter according to an embodiment of the invention.

FIG. 2 is a diagram of a power converter 200 according to an embodiment of the invention. The power converter 200 at least includes a spike suppression circuit 201 and a transformer 240. However, the spike suppression circuit 201 may be used independently, and it is not limited to the application in the power converter 200. In the embodiment of FIG. 2, the spike suppression circuit 201 includes a wide bandgap transistor MG, a first transistor M1, a second transistor M2, a capacitor C1, a clamping circuit 210, a control circuit 220, an LDO (Low-Dropout Regulator) 230, a first resistor R1, and a large resistor RL. The wide bandgap transistor MG may be depletion-type. For example, the wide bandgap transistor MG may be a silicon carbide (SiC) transistor or a gallium nitride (GaN) transistor. Both of the first transistor M1 and the second transistor M2 may be enhancement-type. For example, each of the first transistor M1 and the second transistor M2 may be an NMOS transistor (N-type Metal Oxide Semiconductor Field Effect Transistor).

The wide bandgap transistor MG has a control terminal (e.g., a gate) coupled to a control node NC, a first terminal (e.g., a source) coupled to the common node NM, and a second terminal (e.g., a drain) coupled to an external node NE. The external node NE may be coupled to an element other than the spike suppression circuit 201, such as the transformer 240. The first transistor M1 has a control terminal (e.g., a gate) for receiving a PWM (Pulse Width Modulation) voltage VP, a first terminal (e.g., a source) coupled to a connection node NT, and a second terminal (e.g., a drain) coupled to the common node NM. The first resistor R1 has a first terminal coupled to the connection node MT, and a second terminal coupled to a ground voltage VSS.

The capacitor C1 has a first terminal coupled to a supply node NS for outputting a supply voltage VCC, and a second terminal coupled to the ground voltage VSS. The LDO 230 is coupled to the supply node NS. The LDO 230 is configured to stabilize the supply voltage VCC. The clamping circuit 210 provides a voltage difference VD and includes a first Zener diode DZ1 and a first diode D1 coupled in series.

The first Zener diode DZ1 has an anode coupled to the supply node NS, and a cathode coupled to an internal node NN. The first diode D1 has an anode coupled to the common node NM, and a cathode coupled to the internal node NN. In some embodiments, the supply voltage VCC plus the voltage difference VD is greater than the absolute value of the threshold voltage VTH of the wide bandgap transistor MG, and it can be described as the following equation (1).

$$VCC+VD>|VTH| \qquad (1)$$

where "VCC" represents the supply voltage VCC, "VD" represents the voltage difference VD, and "VTH" represents the threshold voltage VTH of the wide bandgap transistor MG (due to the depletion-type, the threshold value VTH may be a negative value).

Generally, the control circuit 220 generates a selection voltage VS according to the supply voltage VCC, such that the spike suppression circuit 201 operates in either an initial mode or a stable mode. In the initial mode, the wide bandgap transistor MG may be turned on, and the first transistor M1 may be turned off. In the stable mode, the wide bandgap transistor MG and the first transistor M1 may be selectively turned on or turned off.

The second transistor M2 has a control terminal (e.g., a gate) for receiving the selection voltage VS, a first terminal (e.g., a source) coupled to the ground voltage VSS, and a second terminal (e.g., a drain) coupled to the control node NC. The large resistor RL has a first terminal coupled to the control node NC, and a second terminal coupled to the common node NM. For example, the resistance of the large resistor RL may be greater than or equal to 100kΩ. In some embodiments, the spike suppression circuit 201 further includes a second Zener diode DZ2. The second Zener diode DZ2 has an anode coupled to the ground voltage VSS, and a cathode coupled to the control node NC.

Figure 3:
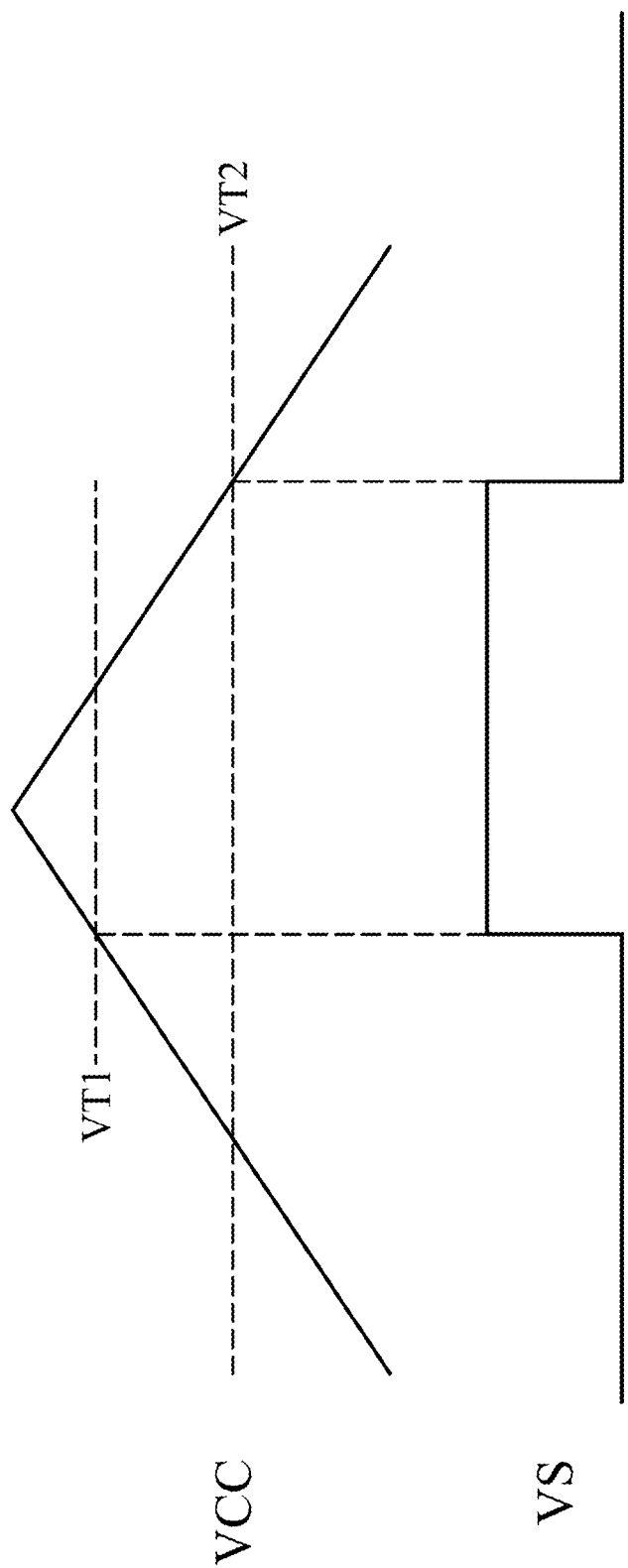
FIG. 3 is a diagram of signal waveforms of a control circuit according to an embodiment of the invention.

FIG. 3 is a diagram of signal waveforms of the control circuit 220 according to an embodiment of the invention. In the embodiment of FIG. 3, the control circuit 220 has hysteresis characteristics, and generates the selection voltage VS according to the supply voltage VCC. For example, the selection voltage VS may become a high logic level (e.g., a logic "1") when the supply voltage VCC rises up to an enable threshold value VT1, and the selection voltage VS may become a low logic level (e.g., a logic "0") when the supply voltage VCC falls down to a disable threshold value VT2. The enable threshold value VT1 may be higher than the disable threshold value VT2.

In some embodiments, the control circuit 220 includes a voltage divider 222, a hysteresis comparator 224, and an inverter 226. The voltage divider 222 includes a second resistor R2 and a third resistor R3 which are coupled in series between the supply node NS and the ground voltage VSS. The voltage divider 222 generates a divided voltage VCX according to the supply voltage VCC. The hysteresis comparator 224 compares the divided voltage VCX with a first threshold value VX1 and a second threshold value VX2, so as to generate a comparison voltage VR. The first threshold value VX1 corresponds to the enable threshold value VT1. The second threshold value VX2 corresponds to the disable threshold value VT2. The inverter 226 inverts the comparison voltage VR, so as to generate the selection voltage VS. The selection voltage VS and the comparison voltage VR have complementary logic levels. In some embodiments, when the selection voltage VS has a low logic level, it represents that the spike suppression circuit 201 operates in the initial mode, and when the selection voltage VS has a high logic level, it represents that the spike suppression circuit 201 operates in the stable mode.

Generally, the power converter can be a flyback converter and support USB PD (Universal Serial Bus Power Delivery). The transformer 240 generates an output voltage VOUT according to an input voltage VIN. For example, the input voltage VIN may an AC (Alternating Current) voltage from a bridge rectifier (not shown), and the output voltage VOUT may be a DC (Direct Current) voltage, but they are not limited thereto. The transformer 240 includes a main coil 241, a secondary coil 242, and an auxiliary coil 243. The main coil 241 and the auxiliary coil 243 may be positioned at the same side of the transformer 240 (e.g., a primary side). The secondary coil 241 may be positioned at the opposite side of the transformer 240 (e.g., a secondary side, which is isolated from the primary side). The main coil 241 has a first terminal for receiving the input voltage VIN, and a second terminal coupled to the external node NE (i.e., the second terminal of the wide bandgap transistor MG). The secondary coil 242 has a first terminal coupled to an output node NO, and a second terminal coupled to the ground voltage VSS. The auxiliary coil 243 has a first terminal coupled to a feedback node NF, and a second terminal coupled to the ground voltage VSS.

In some embodiments, the power converter 200 further includes a second diode D2 and a third diode D3. The second diode D2 has an anode coupled to the feedback node NF, and a cathode coupled to the LDO 230. The third diode D3 has an anode coupled to the output node NO, and a cathode for outputting the output voltage VOUT.

The operation principles of the power converter 200 and its spike suppression circuit 201 will be described as follows. In the initial mode, the PWM voltage VP and the selection voltage VS are maintained at low logic levels, such that the first transistor M1 and the second transistor M2 are both turned off. At this time, the depletion-type wide bandgap transistor MG is turned on, and the conduction current of the wide bandgap transistor MG can flow through the clamping circuit 210, so as to pull up the supply voltage VCC at the supply node NS. When the supply voltage VCC rises up to the enable threshold value VT1 (i.e., the divided voltage VCX rises up to the first threshold value VX1), the selection voltage VS can rise up from a low logic level to a high logic level, so as to switch from the initial mode to the stable mode.

In the stable mode, the second transistor M2 is turned on by the high-logic selection voltage VS, and it can almost pull down the voltage at the control node NC to the ground voltage VSS. Furthermore, the PWM voltage VP provides a driving clock with high-logic intervals and low-logic intervals, so as to alternatively turn on and off the first transistor M1. When the first transistor M1 is turned off, the wide bandgap transistor MG can be completely turned off because the supply voltage VCC plus the voltage difference VD is greater than the absolute value of the threshold voltage VTH of the wide bandgap transistor MG. It should be noted that the spike energy at the common node NM can be transmitted through the clamping circuit 210 to the supply node NS, and can be recycled and stored by the capacitor C1. With such a design, the spike energy does not negatively affect the stability of the power converter 200, and it further forms the supply voltage VCC of the spike suppression circuit 201 so as to save power. Conversely, when the first transistor M1 is turned on, the voltage at the common node NM can be pulled down, and the wide bandgap transistor MG can be turned on. Furthermore, if the supply voltage VCC suddenly falls down to the disable threshold value VT2 (i.e., the divided voltage VCX falls down to the second threshold value VX2), the selection voltage VS can fall down from a high logic level to a low logic level, so as to switch from the stable mode back to the initial mode.

With respect to the other elements, the clamping circuit 210 can provide an almost constant voltage difference VD and limit the transmission direction of energy (e.g., the energy may be only transmitted from the common node NM to the supply node NS). The LDO 230 receives the feedback energy from the auxiliary coil 243, and it is used as another auxiliary power source, so as to help the capacitor C1 stabilize the supply voltage VCC at the supply node NS. The second Zener diode DZ2 can limit the maximum possible voltage of the control node NC, and it can protect the wide bandgap transistor MG from being accidentally damaged. The large resistor RL can reduce the power consumption between the control terminal and the first terminal of the wide bandgap transistor MG.

In some embodiments, the element parameters of the power converter 200 and its spike suppression circuit 201 are as follows. The ground voltage VSS may be set to 0V. The enable threshold value VT1 may be set to 16V. The disable threshold value VT2 may be set to 8V. The resistance of the second resistor R2 may be 9 times of that of the third resistor R3. The first threshold value VX1 may be set to 1.6V. The second threshold value VX2 may be set to 0.8V. The voltage difference VD may be set to 6V. The threshold voltage VTH of the wide bandgap transistor MG may be set to −15V. In the stable mode, the supply voltage VCC may be set to about 12V. It should be understood that the ranges of the above parameters are merely exemplary, and they are freely adjustable according to different requirements.

Figure 4:
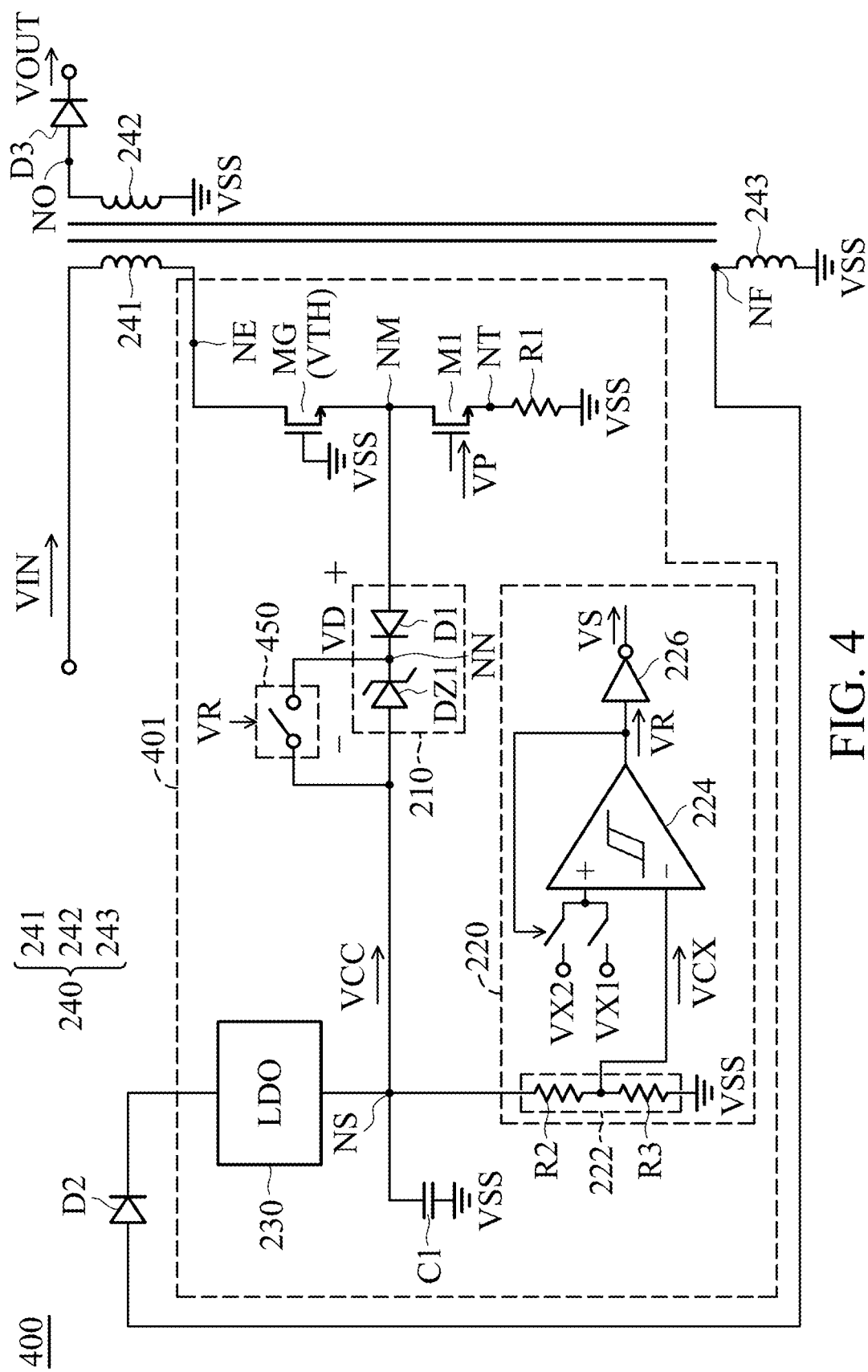
FIG. 4 is a diagram of a power converter according to another embodiment of the invention.

FIG. 4 is a diagram of a power converter 400 according to another embodiment of the invention. The power converter 400 includes a spike suppression circuit 401. FIG. 4 is similar to FIG. 3. In the embodiment of FIG. 4, the spike suppression circuit 401 further includes a switch element 450, but does not include the second transistor M2, the large resistor RL, and the second Zener diode DZ2 as described above. The wide bandgap transistor MG has a control terminal coupled to the ground voltage VSS, a first terminal coupled to the common node NM, and a second terminal coupled to the external node NE. The switch element 450 has a first terminal coupled to the supply node NS, and a second terminal coupled to the internal node NN. The switch element 450 is selectively closed or opened according to the comparison voltage VR or the inverse of the selection voltage VS. For example, in the initial mode, the switch element 450 is closed to provide a relatively small voltage difference VD since the selection voltage VS has a low logic level and the comparison voltage VR has a high logic level. In the stable mode, the switch element 450 is opened to provide a relatively large voltage difference VD since the selection voltage VS has a high logic level and the comparison voltage VR has a low logic level. With such a design, the clamping circuit 210 can provide a variety of voltage differences VD in the initial mode and the stable mode by selectively bypassing the first Zener diode DZ1. Thus, the above designs of the second transistor M2 and the large resistor RL can be omitted. Other features of the power converter 400 and the spike suppression circuit 401 of FIG. 4 are similar to those of the power converter 200 and the spike suppression circuit 201 of FIG. 2. Therefore, the two embodiments can achieve similar levels of performance.

Figure 5:
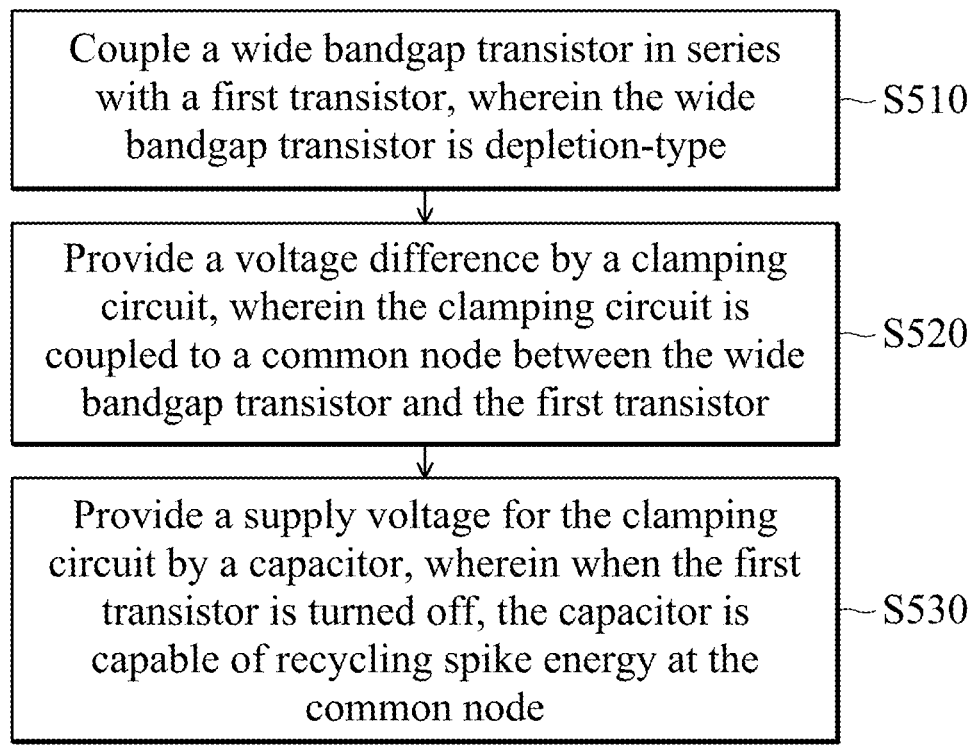
FIG. 5 is a flowchart of a control method for spike suppression according to an embodiment of the invention.

FIG. 5 is a flowchart of a control method for spike suppression according to an embodiment of the invention. The control method includes the following steps. In step S510, a wide bandgap transistor is coupled in series to a first transistor. The wide bandgap transistor is depletion-type. In step S520, a voltage difference is provided by a clamping circuit. The clamping circuit is coupled to a common node between the wide bandgap transistor and the first transistor. In step S530, a supply voltage is provided for the clamping circuit by a capacitor. When the first transistor is turned off, the capacitor is capable of recycling spike energy at the common node. It should be noted that it is not required that the above steps be performed in order, and all of the features of the embodiments of FIGS. 1 to 4 may be applied to the communication method of FIG. 5.

The invention proposes a novel spike suppression circuit, a novel power converter, and a novel control method thereof. In comparison to the conventional design, the invention has at least the advantages of reducing spike interference, recycling spike energy, increasing system stability, and saving power, and therefore it is suitable for application in a variety of electronic devices.

Note that the above voltages, currents, resistances, inductances, capacitances and other element parameters are not limitations of the invention. A designer can adjust these parameters according to different requirements. The spike suppression circuit, the power converter, and the control method of the invention are not limited to the configurations of FIGS. 1-5. The invention may merely include any one or more features of any one or more embodiments of FIGS. 1-5. In other words, not all of the features displayed in the figures should be implemented in the spike suppression circuit, the power converter, and the control method of the invention. Although the embodiments of the invention use MOSFET as examples, the invention is not limited thereto, and those skilled in the art may use other types of transistors, such as BJT (Bipolar Junction Transistor), JFET (Junction Gate Field Effect Transistor), FinFET (Fin Field Effect Transistor), etc., without affecting the performance of the invention.

The method of the invention, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:

1. A spike suppression circuit, comprising:
   a wide bandgap transistor, wherein the wide bandgap transistor is depletion-type;
   a first transistor, coupled in series with the wide bandgap transistor;
   a clamping circuit, providing a voltage difference, and coupled to a common node between the wide bandgap transistor and the first transistor; and
   a capacitor, providing a supply voltage for the clamping circuit;
   wherein when the first transistor is turned off, the capacitor is capable of recycling spike energy at the common node.

2. The spike suppression circuit as claimed in claim 1, further comprising:
   a control circuit, generating a selection voltage according to the supply voltage, such that the spike suppression circuit operates in an initial mode or a stable mode.

3. The spike suppression circuit as claimed in claim 2, wherein the wide bandgap transistor has a control terminal coupled to a control node, a first terminal coupled to the common node, and a second terminal coupled to an external node.

4. The spike suppression circuit as claimed in claim 3, further comprising:
   a second Zener diode, wherein the second Zener diode has an anode coupled to a ground voltage, and a cathode coupled to the control node.

5. The spike suppression circuit as claimed in claim 3, further comprising:
   a second transistor, wherein the second transistor has a control terminal for receiving the selection voltage, a first terminal coupled to a ground voltage, and a second terminal coupled to the control node; and
   a large resistor, wherein the large resistor has a first terminal coupled to the control node, and a second terminal coupled to the common node.

6. The spike suppression circuit as claimed in claim 2, wherein the capacitor has a first terminal coupled to a supply node for outputting the supply voltage, and a second terminal coupled to a ground voltage.

7. The spike suppression circuit as claimed in claim 6, further comprising:
   an LDO (Low-Dropout Regulator), coupled to the supply node, wherein the LDO is configured to stabilize the supply voltage.

8. The spike suppression circuit as claimed in claim 6, wherein the clamping circuit comprises:
   a first Zener diode, wherein the first Zener diode has an anode coupled to the supply node, and a cathode coupled to an internal node; and
   a first diode, wherein the first diode has an anode coupled to the common node, and a cathode coupled to the internal node.

9. The spike suppression circuit as claimed in claim 8, further comprising:
   a switch element, controlled according to the selection voltage, wherein the switch element has a first terminal coupled to the supply node, and a second terminal coupled to the internal node;
   wherein the switch element is closed in the initial mode, and the switch element is opened in the stable mode.

10. The spike suppression circuit as claimed in claim 2, wherein the control circuit has hysteresis characteristics, the selection voltage becomes a high logic level when the supply voltage rises up to an enable threshold value, and the selection voltage becomes a low logic level when the supply voltage falls down to a disable threshold value.

11. The spike suppression circuit as claimed in claim 2, wherein the control circuit comprises:
    a voltage divider, comprising a second resistor and a third resistor coupled in series, wherein the voltage divider generates a divided voltage according to the supply voltage;
    a hysteresis comparator, comparing the divided voltage with a first threshold value and a second threshold value, so as to generate a comparison voltage; and
    an inverter, inverting the comparison voltage, so as to generate the selection voltage.

12. The spike suppression circuit as claimed in claim 1, wherein the supply voltage plus the voltage difference is greater than an absolute value of a threshold voltage of the wide bandgap transistor.

13. The spike suppression circuit as claimed in claim 1, wherein the first transistor has a control terminal for receiving a PWM (Pulse Width Modulation) voltage, a first terminal coupled to a connection node, and a second terminal coupled to the common node.

14. The spike suppression circuit as claimed in claim 13, further comprising:
    a first resistor, wherein the first resistor has a first terminal coupled to the connection node, and a second terminal coupled to a ground voltage.

15. The spike suppression circuit as claimed in claim 1, wherein the wide bandgap transistor has a control terminal coupled to a ground voltage, a first terminal coupled to the common node, and a second terminal coupled to an external node.

16. A power converter, comprising:
    a transformer, generating an output voltage according to an input voltage; and
    a spike suppression circuit, coupled to the transformer, and comprising:
    a wide bandgap transistor, wherein the wide bandgap transistor is depletion-type;
    a first transistor, coupled in series with the wide bandgap transistor;
    a clamping circuit, providing a voltage difference, and coupled to a common node between the wide bandgap transistor and the first transistor; and
    a capacitor, providing a supply voltage for the clamping circuit;
    wherein when the first transistor is turned off, the capacitor is capable of recycling spike energy at the common node.

17. The power converter as claimed in claim 16, wherein the power converter is a flyback converter and supports USB PD (Universal Serial Bus Power Delivery).

18. The power converter as claimed in claim 16, wherein the transformer comprises:
    a main coil, wherein the main coil has a first terminal for receiving the input voltage, and a second terminal coupled to the wide bandgap transistor;
    a secondary coil, wherein the secondary coil has a first terminal coupled to an output node, and a second terminal coupled to a ground voltage; and
    an auxiliary coil, wherein the auxiliary coil has a first terminal coupled to a feedback node, and a second terminal coupled to the ground voltage.

19. The power converter as claimed in claim 18, further comprising:
- an LDO (Low-Dropout Regulator), configured to stabilize the supply voltage;
- a second diode, wherein the second diode has an anode coupled to the feedback node, and a cathode coupled to the LDO; and
- a third diode, wherein the third diode has an anode coupled to the output node, and a cathode for outputting the output voltage.

20. A control method for spike suppression, comprising the steps of:
- coupling a wide bandgap transistor in series with a first transistor, wherein the wide bandgap transistor is depletion-type;
- providing a voltage difference by a clamping circuit, wherein the clamping circuit is coupled to a common node between the wide bandgap transistor and the first transistor; and
- providing a supply voltage for the clamping circuit by a capacitor;
- wherein when the first transistor is turned off, the capacitor is capable of recycling spike energy at the common node.

* * * * *